(12) United States Patent
Brockman et al.

(10) Patent No.: US 9,702,939 B2
(45) Date of Patent: Jul. 11, 2017

(54) BATTERY CHARGING AND MAINTAINING WITH DEFECTIVE BATTERY MONITORING

(71) Applicant: Johnson Controls Technology Company, Holland, MI (US)

(72) Inventors: Daryl C. Brockman, Schorewood, WI (US); Joseph E. Liedhegner, Wauwatosa, WI (US)

(73) Assignee: Johnson Controls Technology Company, Holland, MI (US)

( * ) Notice: Subject to any disclaimer, the term of this patent is extended or adjusted under 35 U.S.C. 154(b) by 330 days.

(21) Appl. No.: 13/910,760

(22) Filed: Jun. 5, 2013

(65) Prior Publication Data

US 2013/0328522 A1    Dec. 12, 2013

Related U.S. Application Data

(60) Provisional application No. 61/656,408, filed on Jun. 6, 2012.

(51) Int. Cl.
*G01R 31/36* (2006.01)
*H02J 7/00* (2006.01)
*H01M 10/44* (2006.01)
*H01M 10/42* (2006.01)

(52) U.S. Cl.
CPC ........ *G01R 31/3606* (2013.01); *H01M 10/44* (2013.01); *H02J 7/0031* (2013.01); *H02J 7/0052* (2013.01); *H01M 2010/4271* (2013.01)

(58) Field of Classification Search
CPC .......................... G01R 31/3606; H02J 7/0052
USPC ........................................................ 320/107
See application file for complete search history.

(56) References Cited

U.S. PATENT DOCUMENTS

| 3,590,326 A | * | 6/1971 | Watson | ............................ 361/96 |
| 3,835,362 A | * | 9/1974 | Greene | .............. G01R 31/3606 320/134 |
| 4,820,965 A | * | 4/1989 | Siemer | ......................... 320/165 |
| 6,124,700 A | * | 9/2000 | Nagai | .................... H02J 7/0052 320/130 |

(Continued)

FOREIGN PATENT DOCUMENTS

| CN | 101329381 | 12/2008 |
| GB | 2440065 A | 1/2008 |

OTHER PUBLICATIONS

International Search Report and Written Opinion for PCT Application No. PCT/US2013/044492 dated Mar. 5, 2014; 9 pgs.
CN 201380041547.X Office Action dated Aug. 3, 2016.

*Primary Examiner* — Samuel Berhanu
*Assistant Examiner* — Tarikh Rankine
(74) *Attorney, Agent, or Firm* — Fletcher Yoder, P.C.

(57) ABSTRACT

The present disclosure relates to a system for charging or maintaining a battery that includes power conversion circuitry configured to provide output power for charging or maintaining the battery. The system also includes electrical conductors coupled to the power conversion circuitry and configured to be coupled to the battery for charging or maintaining the battery. Additionally, the system includes control circuitry coupled to the power conversion circuitry and configured to monitor charging or maintaining of the battery. The control circuitry is further configured to determine whether the battery may be defective or failing based upon the output power and a time threshold.

17 Claims, 3 Drawing Sheets

(56) References Cited

U.S. PATENT DOCUMENTS

| | | | | |
|---|---|---|---|---|
| 6,144,185 A | * | 11/2000 | Dougherty et al. | 320/132 |
| 6,259,254 B1 | * | 7/2001 | Klang | G01R 31/3631 |
| | | | | 324/427 |
| 6,453,249 B1 | * | 9/2002 | Shibutani | G01R 31/3679 |
| | | | | 320/132 |
| 2003/0141845 A1 | * | 7/2003 | Krieger | H02J 7/0054 |
| | | | | 320/132 |
| 2006/0139010 A1 | * | 6/2006 | Wang | G01R 31/3624 |
| | | | | 320/136 |
| 2006/0145658 A1 | * | 7/2006 | Wang | H02J 7/0047 |
| | | | | 320/107 |
| 2009/0195211 A1 | * | 8/2009 | Wang | G01R 31/3679 |
| | | | | 320/136 |
| 2010/0127663 A1 | | 5/2010 | Furukawa et al. | |
| 2011/0302437 A1 | | 12/2011 | Haddab et al. | |

\* cited by examiner

BATTERY CHARGING AND MAINTAINING WITH DEFECTIVE BATTERY MONITORING

CROSS REFERENCE TO RELATED APPLICATIONS

This application claims priority from and the benefit of U.S. Provisional Application Ser. No. 61/656,408, entitled "BATTERY CHARGER/MAINTAINER SAFETY FUNCTION FOR FAILING BATTERIES," filed Jun. 6, 2012, which is hereby incorporated by reference.

BACKGROUND

The present application relates generally to battery devices and systems and, more particularly, to systems and methods for monitoring battery charging or maintaining.

Batteries composed of one or more electrochemical cells capable of converting chemical energy into a more readily usable form of electrical energy are widely employed in many industries and applications. For example, many such batteries are starting, lighting, and ignition (SLI) batteries capable of starting the internal combustion engines of cars, trucks, motorcycles, and other vehicles. Vehicle batteries of this type can typically be discharged and replenished with charge in multiple cycles before the life cycle of the battery is depleted. In addition, deep cycle batteries are capable of providing continuous electrical and/or motive power to vehicles such as golf carts. Such batteries are typically discharged slowly and almost completely before being recharged.

Battery chargers and maintainers are typically used to replenish the charge stored in vehicle batteries for a number of reasons. The vehicle may be stored for a long time without use, a light or other load left on while the vehicle is not running may drain the battery, or the battery may simply lose charge over time and need additional charge. While such discharge is normal, abnormal conditions that represent or that could be signs of impending failure may also occur. Such conditions may be considered to render the battery defective or failing, and may occur on both new batteries (e.g., on or before the initial charge) and in-service batteries. In certain situations, it may be difficult to identify a battery that is defective or failing while it is on the charger. In such situations, it may be desirable to identify the failing battery so that it may be removed from the charger. Accordingly, a need exists for a system to assist in the identification of defective or failing batteries during charging and/or maintaining.

SUMMARY

The present disclosure relates to a system for charging or maintaining a battery that includes power conversion circuitry configured to provide output power for charging or maintaining the battery. The system also includes electrical conductors coupled to the power conversion circuitry and configured to be coupled to the battery for charging or maintaining the battery. Additionally, the system includes control circuitry coupled to the power conversion circuitry and configured to monitor charging or maintaining of the battery. The control circuitry is further configured to determine whether the battery may be defective or failing based upon the output power and a time threshold.

The present disclosure also relates to a system for charging or maintaining a battery that includes power conversion circuitry configured to provide output power for charging or maintaining the battery, and electrical conductors coupled to the power conversion circuitry and configured to be coupled to the battery for charging or maintaining the battery. The system also includes control circuitry coupled to the power conversion circuitry and configured to monitor charging or maintaining of the battery. The control circuitry is further configured to determine whether the battery may be defective or failing based upon a charging or maintaining current, a current threshold, and a time threshold based upon the size of the battery.

The present disclosure further relates to a method of charging or maintaining a battery that includes monitoring an output power provided by power conversion circuitry for charging or maintaining the battery, and identifying the battery as failing based upon the output power and a time threshold.

DRAWINGS

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As described in more detail below, present embodiments are directed towards systems and methods for battery charging and maintaining with defective battery monitoring. Systems and methods include power conversion circuitry, which provides output power for charging or maintaining a battery; electrical conductors coupled to the power conversion circuitry, which couple to the battery for charging and maintaining; and control circuitry coupled to the power conversion circuitry and configured to monitor the charging or maintaining of the battery. The control circuitry also determines whether the battery may be defective or failing based upon the output power and a time threshold. In other embodiments, the control circuitry determines whether a charging or maintaining current of the output power has exceeded a current threshold for at least the time threshold. If the current of the output power has exceeded the current threshold for at least the time threshold, the system may alert a user that the battery is identified as defective or failing.

Figure 1:
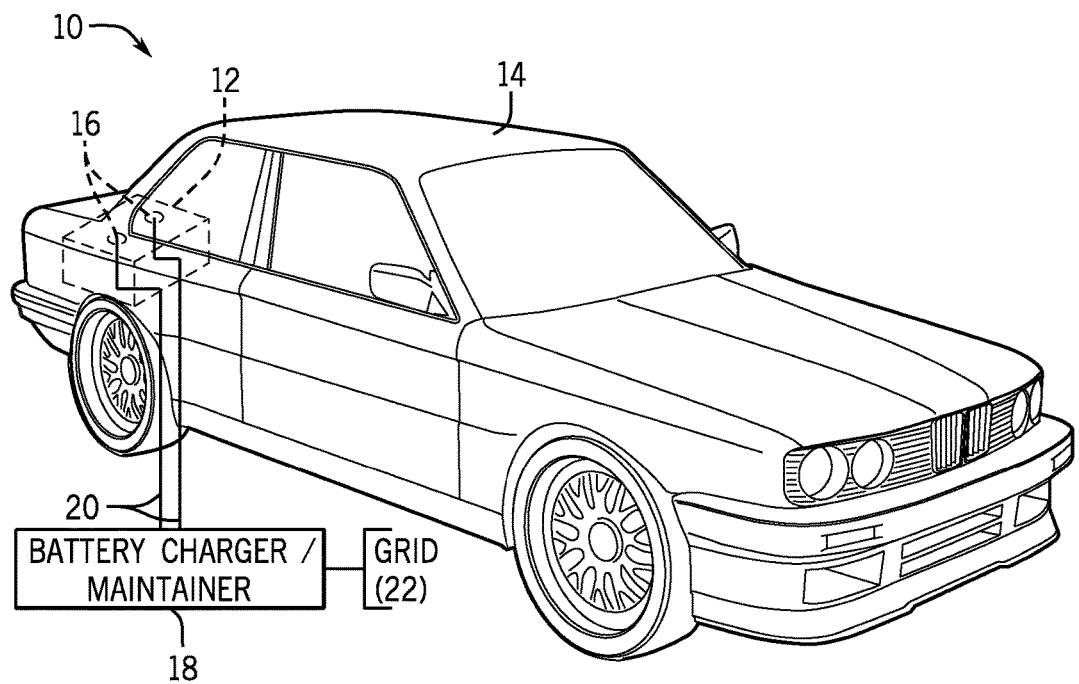
FIG. 1 is a perspective view of an embodiment of a vehicle having a battery module and showing attachment of the battery to a charger or maintainer adapted to detect potential defects or a failing battery.

With the foregoing in mind, FIG. 1 illustrates a battery charging/maintaining system 10, including a battery 12 disposed in a vehicle 14. The battery may typically be used in a vehicle, as shown, which may be a car, truck, boat, recreational vehicle, golf cart, or other vehicle that uses battery power. The battery 12 may comprise a starting, lighting, and ignition (SLI) battery of any desired design, type, voltage, and capacity, as well as deep cycle batteries, depending on the vehicle type and the application. Moreover, the battery may be designed and constructed in accordance with any currently known or later developed technology, such as wet cell technologies, glass mat technologies, gel cell technologies, etc. The battery 12 includes positive and negative terminals 16, and to enable charging, the terminals 16 of the battery 12 may be attached to a battery charger/maintainer 18 with leads 20, or any other electrical conductors. Once the terminals 16 are electrically coupled to the charger/maintainer 18, electrical charging power may be applied through the leads 20 to build up a charge in the battery 12. The battery charger/maintainer 18 may receive power from a power grid 22 or other power source, which provides AC power to the battery charging/maintaining system 10. As may be understood by one skilled in the art, the battery charger/maintainer 18 may be portable, or may have a fixed location.

Figure 2:
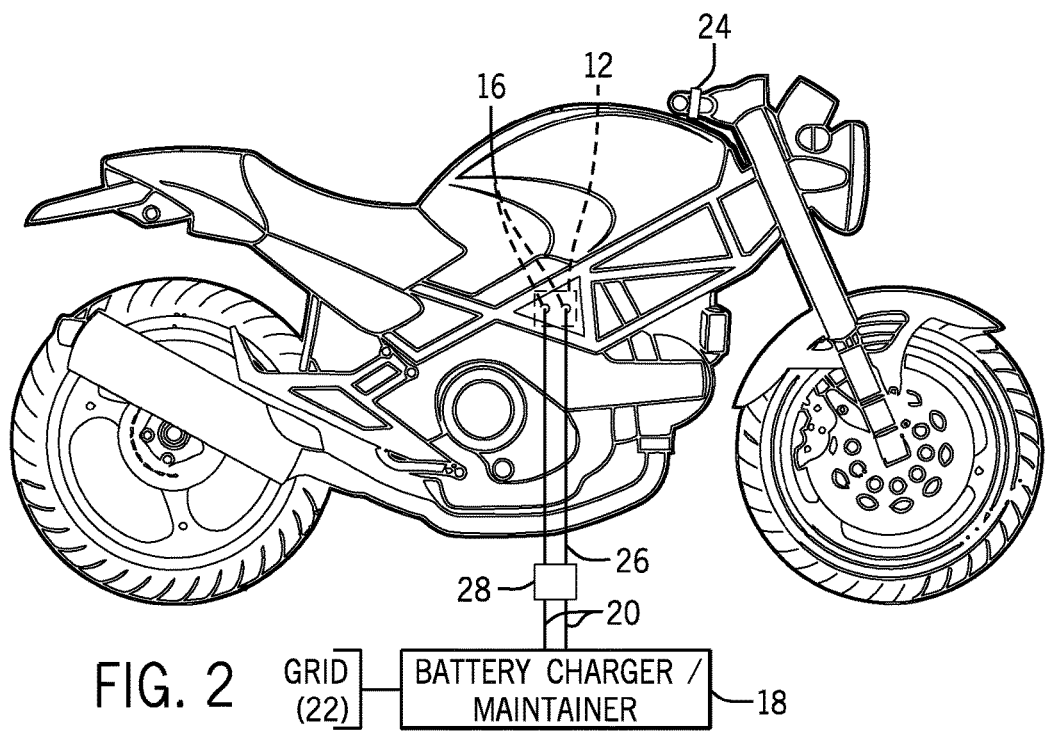
FIG. 2 is a perspective view of an embodiment of a motorcycle having a battery module, and similarly coupled to a charger or maintainer for adapted to detect potential defects or a failing battery.

Similarly, FIG. 2 illustrates a motorcycle 24 having the battery 12 attached to the battery charger/maintainer 18. Because the battery 12 in the motorcycle 24 (or certain other vehicles) may be difficult to access, the system may include one or more tethers 26, which may extend from the terminals 16 to allow the user to charge or maintain the battery 12 without requiring any disassembly to reach the terminals. A connector 28 may extend between the tether 26 and the leads 20 to charge the battery 12. As when charging the vehicle 14, the power grid 22 may provide AC power to the battery charging/maintaining system 10. Such arrangements may facilitate connection of the battery to the charger/maintainer by simply plugging the device into the connector when desired.

Figure 3:
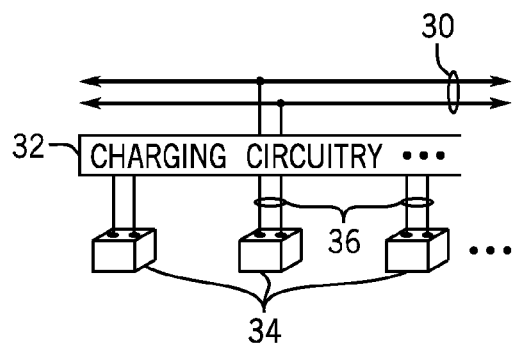
FIG. 3 is a schematic of an embodiment in which multiple batteries are initially charged, such as in a factory or processing center, illustrating a collective charging installation that may be similarly adapted to detect defects or a failing battery.

FIG. 3 shows an embodiment of the charging/maintaining system 10 having a common power bus 30 attached to charging circuitry 32 to charge/maintain a series of batteries 34, such as for initial charging or for maintaining a stock of batteries when stored. In such an embodiment, the series of batteries 34 may be charged and monitored individually and simultaneously by one or multiple battery charger/maintainers 18. Such batteries 34 may be found at a factory, a battery manufacturing facility, a processing center, or a testing facility, for example, and the initially charging batteries 34 may be newly manufactured batteries 12 or previously manufactured batteries 12 that have not been charged, or for which a charge may be maintained until the batteries enter into service. One charger/maintainer 18 may be used, or multiple charger/maintainers 18 may be included, depending on the needs of the system 10. The power bus 30 may extend along the charging circuitry 32, and include positive and negative conductors supplying charging power to the charging circuitry 32. The charging circuitry 32 may regulate the battery 12 charging current and time, among other things. The charging circuitry 32 may then electrically connect to the terminals 16 of the batteries 34 via factory leads 36, which may be wired connectors, as in FIGS. 1 and 2, or the leads 36 may be conductive rails that enable the batteries 34 to slide into a charging position. Thus, the battery 12 charger/maintainer 18 may charge a plurality of batteries 34.

Figure 4:
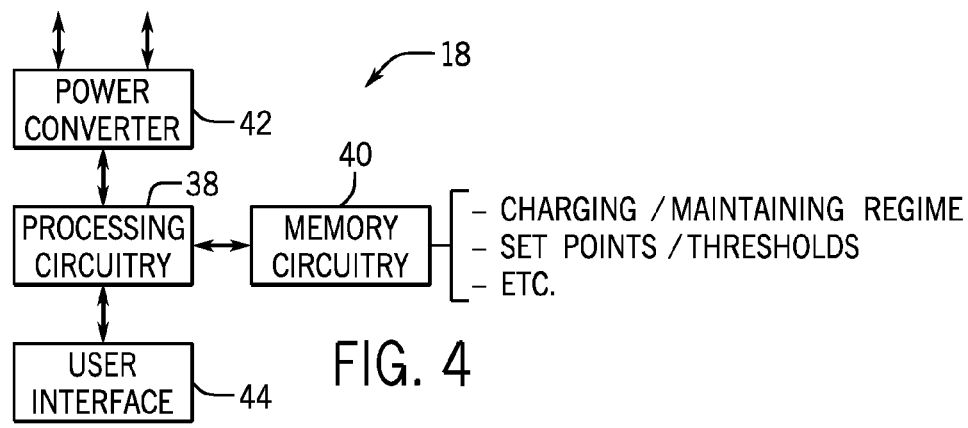
FIG. 4 is a diagrammatical representation of an exemplary embodiment of certain of the functional components of a system of the type shown in FIGS. 1-3.

The exemplary systems and applications illustrated in FIGS. 1-3 all use a novel technique for monitoring parameters of battery charging or maintaining and utilize the monitoring information to determine whether one or more batteries may be failing, defective, or developing a defect. FIG. 4 is a diagrammatical representation of certain of the functional components included in the charger/maintainer 18 adapted for this purpose. The battery charger/maintainer 18 includes processing circuitry 38 and associated memory circuitry 40 that cooperate to store and execute the functions of the system, and in particular, one or more charging regimes and analysis processes for detecting potential battery defects or failure. A power converter 42 includes the power conversion circuitry which is controlled by the processing circuitry 38, and supplies the charging power to the battery terminals through the leads. In embodiments where the battery 12 is being maintained rather than charged, the power converter 42 may be configured to deliver a charge to the battery 12 at a low rate, and further, to stop delivering charge automatically when the battery 12 is fully charged. This type of charging, as will be appreciated by those skilled in the art, may be useful for keeping a charge on a battery 12 for a vehicle 14 that is not used often (e.g., a motorcycle, a boat, a classic car, a large car used for family trips, etc.). Electrical power for performing these operations is typically conveyed to the power converter 42 from the grid 22, although other power sources may be used. The power converter receives control signals from the processing circuitry 38, which may run parameter inputs and user selections through one or more algorithms to determine an appropriate amount of charging power to be applied to the battery 12. In some embodiments, more than one charging and/or maintaining regime may be pre-programmed and stored in the device to permit the charging and/or maintaining of different types of batteries, different sizes and ratings of batteries, different battery voltages, and so forth. Such regimes are stored in the memory circuitry and executed by the processing circuitry to control the charging/maintaining of the battery 12, as well as to perform instructions to regulate the charging/maintaining system 10 as a whole.

Further, the system may include one or more sensors (not separately shown) that can monitor charging and battery state parameters, such as voltage and current. These parameters may be accessed and stored in the memory circuitry for use by the processing circuitry. The processing circuitry may be configured to monitor the battery 12, and start certain procedures based on the data gathered. For example, the processing circuitry 38 may respond to set points or thresholds chosen by the user based upon the size of the battery (e.g., the capacity), the level of discharge, the expected charge time, and the expected usage of the battery. The memory circuitry 40 may provide the processing circuitry 38 with data regarding the charging/maintaining regime, set points and/or thresholds for the system 10 (e.g., output power, current, and/or time thresholds), etc.

The set points or thresholds may be units of time, voltage, current, power, or any combination of these or other parameters. For example, in certain embodiments, such as for a 12 volt automotive battery, it may be preferable to set a current threshold of between approximately 1 and 10 amps, 2 and 6 amps, 2.5 and 5 amps, or any suitable range, and a time threshold of between approximately 6 and 72 hours, 12 and 48 hours, 18 and 24 hours, or any other suitable range. In a presently contemplated embodiment, the current threshold is 3 amps and the time threshold is 24 hours. These threshold values may vary and may be tuned to the specific battery or application. For instance, the time threshold may be configured to be longer for larger batteries that require a longer charge time, and shorter for smaller batteries that require a shorter charge time. If the processing circuitry 38 identifies that the battery 12 has exceeded a certain combination of these set points or thresholds, such as if, for example, the battery 12 has exceeded the current threshold for the length of the time threshold, the processing circuitry 38 may indentify the battery 12 as potentially defective or failing. In certain embodiments, the processing circuitry 38 includes instructions to gather data from the battery 12, such as voltage, current, ampere hours, ampere hours per an interval, terminal temperature, battery temperature, and battery charger/maintainer temperature. The processing circuitry 38 may consider any combination of this data to determine whether the battery 12 may be potentially defective or failing.

The user interface 44 may be any kind of operator interface 44, such as a vehicle dashboard or an LCD screen, and it may accept various charging parameter inputs and user selections, as well as display charge information. In the event that the battery 12 is identified as potentially defective or failing, the user interface 44 may issue a notice, or the system 10 may produce other alerts to notify the user that the battery 12 may be defective or failing.

Figure 5:
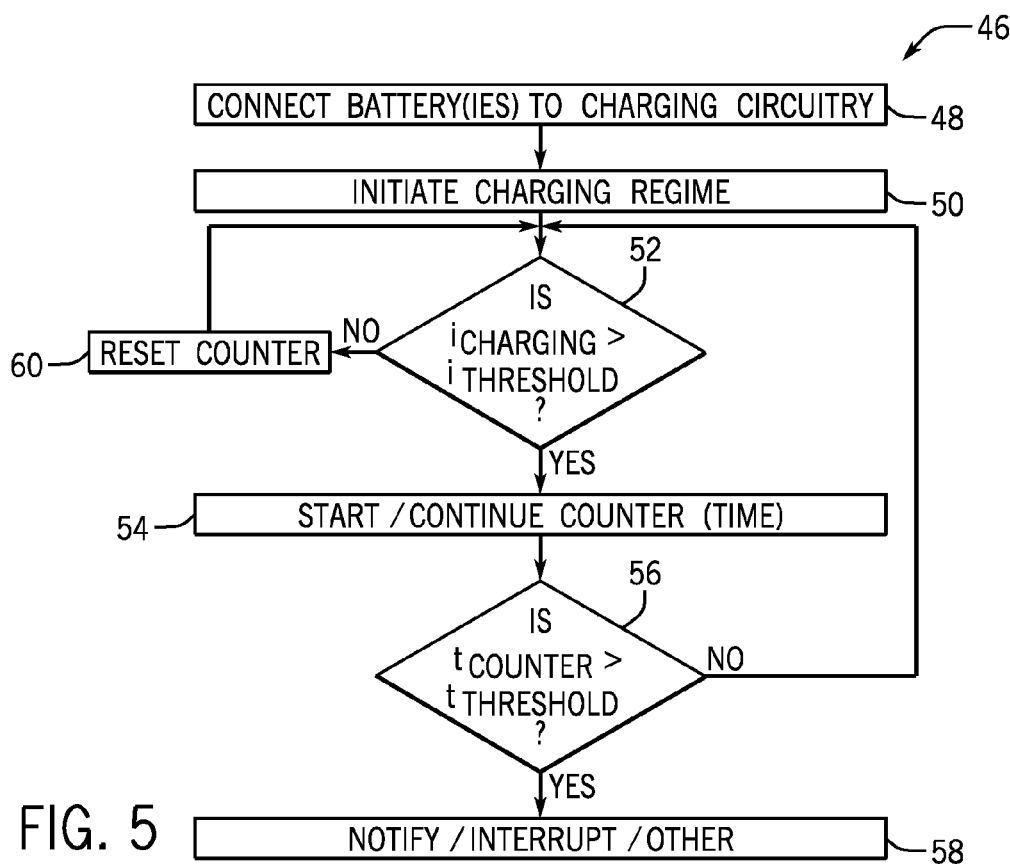
FIG. 5 is a flow chart representing exemplary logic of a charging regime adapted to detect potential battery defects or a failing battery.

FIG. 5 is a flowchart depicting exemplary logic 46 executed by the charging/maintaining system 10 for detecting a potentially defective or failing battery. First, the battery or batteries are connected to the charging circuitry, as indicated at step 48. As described above, the charging circuitry may contain instructions for the charging/maintaining regime, information regarding set points and/or thresholds, and other information. Next, the charging regime is initiated as indicated at step 50. Initiating the charging regime may include providing power to the battery and initiating the monitoring of battery current, voltage, temperature, etc. Here again, the charging and/or maintaining may be done in accordance with any desired charging and/or maintaining regime, and may be adapted to the particular battery or batteries to be charged. Data is collected during battery monitoring for use in determining whether the battery is potentially defective or failing. For example, data on the voltage in the battery may be used to help determine the charge left in a particular battery. However, at certain times in the charging cycle (e.g., late in the charging cycle) if the current in a particular battery is greater than a pre-determined threshold for an extended time, this could indicate that the battery is defective or may be failing. As represented by step 52 of FIG. 5, the charging/maintaining system may monitor the current to the battery to determine whether it indicates that the charging current is greater than a threshold value. This value may be preset, and may be different for different battery types, ratings, sizes and so forth.

If the charging current of the battery is found to be greater than the predetermined current threshold, a counter (e.g., a timer) is started, as shown by step 54. The counter may be software, hardware, or firmware implementation, or a combination of these. The system 10 continuously or periodically monitors whether the charging current of the battery 12 remains higher than the current threshold. As shown in block 56, if the charging current is found to be higher than the threshold current for a set time, as measured by the counter, that is greater than a predetermined threshold time, then the system notifies the user, interrupts the charging, or takes another action that identifies that the battery 12 may be defective or failing, as indicated at step 58. If during the charging regime, the charging current drops below the charging threshold, the counter is reset, as indicated at step 60, and the current will continue to be monitored to determine whether it again rises above the threshold. In some situations, the system may only reset the timer if an average of the monitored parameter of the output power falls below the threshold before the time threshold is reached. The time allowed before the determination that a battery is potentially defective or failing may, of course, be adapted for different batteries, particularly as a function of their size, rating, voltage, and so forth. The particular current and time thresholds may be determined empirically for different batteries.

Figure 6:
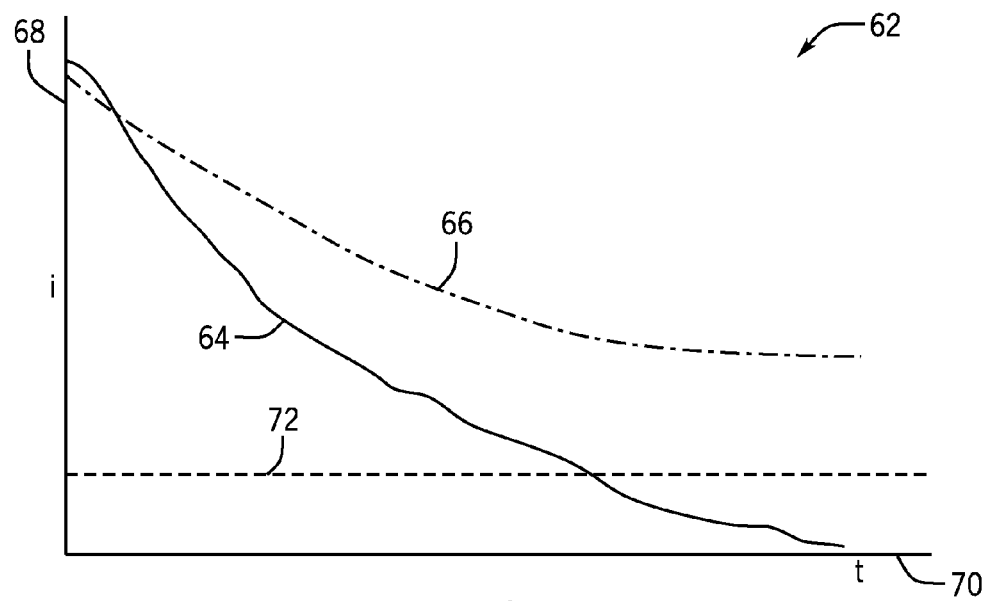
FIG. 6 is a graphical representation of an exemplary current input trace of a failing or defective battery during initial charging, used to detect potential defects or a failing battery.

FIG. 6 is a graphical representation of a current traces 62 showing the behavior of a typical charging battery and a failing charging battery. The traces 62 include a first current trace 64 corresponding to a typical charging battery, and trace 66 corresponds to an exemplary defective or failing battery. The traces are illustrated by magnitude of charging current, as indicated by current axis 68 over time 70. The current threshold under which the charge current should fall during normal charging is represented by line 72. Trace 62 shows that at the beginning of the charging process of a typical discharged battery, the battery may accept the current output of the charger/maintainer and remain above the current threshold 72 until the battery approaches full charge, at which time the current will fall below the current threshold. The length of time that the battery accepts a current higher than the current threshold 72 varies depending on the size of the battery and the level of discharge, and may be reflected by the time threshold set for the evaluation. A battery with a longer charge cycle (e.g., a larger battery) may require a longer time threshold than a battery with a shorter charge cycle (e.g., a smaller battery). Once the battery is nearing the end of its charge cycle, the current will typically taper to a very low level, well below the current threshold 72, where it will remain until the battery is removed from the charger/maintainer. Trace 66 indicates that, like the typical healthy battery, a defective or failing battery may accept the full current output of the battery charger/maintainer 18 at the beginning of the charging process. However, as time progresses, the current does not decrease below the current threshold 72 as expected. In certain situations, such as the one represented by trace 66, the current may never fall below the current threshold. If the current has not fallen below the current threshold 72 before the time threshold is reached, the battery is determined to be defective or failing.

Figure 7:
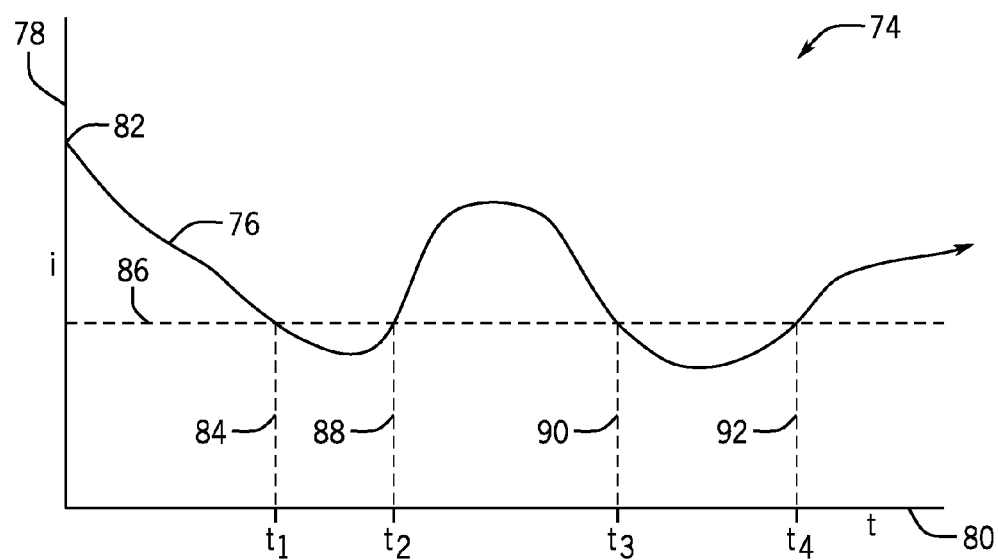
FIG. 7 is a graphical representation of an exemplary current trace for a failing or defective in-service battery during charging or maintaining.

In certain situations, the current of a typical, non-defective battery may temporarily rise above the current threshold, as illustrated in FIG. 7. FIG. 7 is a time versus current plot 74 for the battery that displays a "false alarm," where the current temporarily rises unexpectedly, but that later does develop a defect or failure indication. Specifically, the plot 74 comprises a trace 76 corresponding to the typical battery being charged/maintained by the battery charger/maintainer, here again illustrated in terms of a current 78 over time 80. The trace 76 begins the charging process normally at an initial high current 82. At a first time 84, the current falls below a current threshold 86, indicating that the battery is reaching full charge, as would be expected. However, at a second time 88, the trace 76 again rises above the threshold 86. In a non-defective battery, this increase in current could be a result of normal behavior, such as opening a door, turning on dome lights, or turning on a sound system or other load while the battery is charging/maintaining. Such actions while the battery is on the charger/maintainer 18 might temporarily cause the current to rise above the current threshold 86, as shown, but in accordance with the present techniques should not be and are not considered as necessarily indicative of a defective or failing battery (unless they continue beyond the time threshold).

Once these actions are discontinued, the current will again fall below the current threshold 86 around a third time 90. As long as the length of time between the second time 88 and the third time 90 is smaller than the pre-determined time threshold, the battery will not be identified as potentially defective or failing. If the charging current of the battery again rises above the current threshold 86, such as at a fourth time 92, and remains above the threshold for the length of the selected time threshold, then the battery will be identified as potentially defective or failing. In this way, the charging/maintaining system may reduce the number of non-failing batteries 12 that are identified as failing. As discussed above, one or more actions may be taken when the battery or batteries are determined to be potentially defective or failing. Such actions may include interrupting further charging or maintaining, altering a charging or maintaining regime, notifying the user, and so forth. In some embodiments, particularly in systems designed for initial charging, information on the battery type, design, manufacturing time and place, and/or on the individual battery may be detected and stored for later evaluation of defects occurring both to individual batteries as well as to groups of batteries. Such data may be stored in the charging/maintaining system, or sent to other monitoring and evaluation systems for processing and analysis.

In other embodiments of the current disclosure, other parameters may be monitored to enable the calculation of the output power of the power conversion circuitry of the battery charger/maintainer. As such, the power may be monitored, such as based on the parameters that may include output current and voltage. It is understood that such a system may include a threshold time, as described above, as well as a power threshold. The power of the battery should fall below the power threshold as it is charged/maintained, and if it does not, or if it rises above the threshold for at least the preset time threshold, the battery may be considered defective or failing.

One or more of the disclosed embodiments, alone or in combination, may provide one or more technical effects useful in the methods and manufacture of battery charging/maintaining systems. For example, certain embodiments of the present approach may enable improved battery monitoring. By specific example, monitoring a charging output of the battery, and identifying the battery as failing based upon the output power and a time threshold, as set forth above, may enable the detection of defective or failing batteries while they are charging or maintaining, so that it may be removed from the charger/maintainer. As such, the systems and methods for battery monitoring, as presently disclosed, may generally enable improved detection of defective or failing batteries during charging and/or maintaining. The technical effects and technical problems in the specification are exemplary and are not limiting. It should be noted that the embodiments described in the specification may have other technical effects and can solve other technical problems.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A system for charging or maintaining a battery, comprising:
    power conversion circuitry configured to provide output power for charging or maintaining the battery;
    electrical conductors coupled to the power conversion circuitry and configured to be coupled to the battery, wherein the electrical conductors are configured to convey the output power from the power conversion circuitry to the battery for charging or maintaining the battery; and
    control circuitry coupled to the power conversion circuitry and configured to monitor at least the output power as it is provided from the power conversion circuitry to the battery via the electrical conductors during charging or maintaining of the battery, the control circuitry being further configured to:
        start a timer in response to determining that the charging or maintaining current of the output power is above a current threshold;
        reset the timer in response to determining that the charging or maintaining current of the output power falls below the current threshold before a time threshold is reached; and
        identify that the battery is defective or failing and to interrupt charging or maintaining of the battery in response to identifying that the charging or maintaining current of the output power has exceeded the current threshold for the time threshold.

2. The system of claim 1, wherein the current threshold is between approximately 1 and 10 Amps.

3. The system of claim 2, wherein the current threshold is between approximately 2 and 8 Amps.

4. The system of claim 3, wherein the current threshold is approximately 3 Amps.

5. The system of claim 1, wherein the time threshold is between approximately 6 and 72 hours.

6. The system of claim 5, wherein the time threshold is between approximately 12 and 48 hours.

7. The system of claim 6, wherein the time threshold is approximately 24 hours.

8. The system of claim 1, wherein the control circuitry is configured to re-start the timer in response to determining that the charging or maintaining current of the output power again rises above the current threshold after being below the current threshold.

9. The system of claim 1, comprising a user interface coupled to the control circuitry and configured to accept user inputs and to provide user notifications, wherein the control circuitry is configured to provide a user notice via the user interface in response to determining that the battery is identified as defective or failing.

10. The system of claim 1, wherein the control circuitry is configured to use averaging to determine whether the current threshold is met or exceeded.

11. The system of claim 1, wherein the time threshold is based upon the size of the battery.

12. A system for charging or maintaining a battery, comprising:
    power conversion circuitry configured to provide a charging or maintaining current for charging or maintaining the battery;
    electrical conductors coupled to the power conversion circuitry and configured to be coupled to the battery, wherein the electrical conductors are configured to convey the charging or maintaining current from the power conversion circuitry to the battery for charging or maintaining the battery; and
    control circuitry coupled to the power conversion circuitry and configured to monitor the charging or maintaining current as it is provided from the power conversion circuitry to the battery via the electrical conductors during charging or maintaining of the battery, the control circuitry being configured to separately gather data from the battery, wherein the data includes voltage data, current data, ampere hours data, battery temperature data, or any combination thereof, of the battery, the control circuitry being further configured to:
        start a timer in response to determining that the charging or maintaining current is above a current threshold;
        reset the timer in response to determining that the charging or maintaining current falls below the threshold before a time threshold is reached; and
        interrupt charging or maintaining of the battery in response to identifying that the charging or maintaining current has exceeded the current threshold for the time threshold, wherein the current threshold, the time threshold, or both is based on the data from the battery and the size of the battery.

13. The system of claim 12, wherein the control circuitry is configured to reset the timer in response to determining that the charging or maintaining current again rises above the current threshold after being below the current threshold.

14. A method of charging or maintaining a battery performed by control circuitry communicatively coupled to power conversion circuitry of a battery charger, comprising:
    monitoring a charging or maintaining current of an output power being provided by the power conversion circuitry to the battery during charging or maintaining of the battery;
    starting a timer in response to determining that a charging or maintaining current of the output power rises above a current threshold;
    resetting the timer in response to determining that the charging or maintaining current of the output power falls below the current threshold before a time threshold is reached; and
    identifying the battery as defective or failing and interrupting charging or maintaining of the battery in response to identifying that the charging or maintaining current of the output power has remained above the current threshold for the time threshold.

15. The method of claim 14, comprising resetting the timer in response to determining that the charging or maintaining current of the output power again rises above the threshold after being below the current threshold.

16. A battery charging and maintaining system, comprising:
    power conversion circuitry configured to provide a charging or maintaining current to a battery via electrical conductors;
    one or more sensors configured to monitor the charging or maintaining current;
    control circuitry coupled to the one or more sensors and configured to control operation of the power conversion circuitry, wherein the control circuitry is configured to monitor the charging or maintaining current to determine whether the charging or maintaining current remains above a current threshold for a predetermined amount of time; and
    a user interface communicatively coupled to the control circuitry and configured to accept charging parameter inputs and user selections and to display charge information, wherein the control circuitry is configured to cause the power conversion circuitry to stop providing the charging or maintaining current and to cause the user interface to provide a notification that the battery may be defective or failing in response to identifying that the charging or maintaining current has remained above the current threshold for the predetermined amount of time, wherein the control circuitry is configured to reset a timer in response to determining that the charging or maintaining current rises above the current threshold but subsequently falls below the current threshold before the predetermined amount of time.

17. The system of claim 16, wherein the control circuitry comprises processing circuitry and associated memory circuitry, the memory circuitry storing a plurality of instructions including charging and/or maintaining regimes executable by the processing circuitry to enable the charging and/or maintaining of different sizes and ratings of batteries.

\* \* \* \* \*